United States Patent [19]

Tsukakoshi et al.

[11] Patent Number: 4,983,850
[45] Date of Patent: Jan. 8, 1991

[54] ION IMPLANTATION DEVICE

[75] Inventors: Osamu Tsukakoshi, Hiratsuka; Yuzo Sakurada, Fujisawa; Kazuhiro Kashimoto, Hatano, all of Japan

[73] Assignee: Nihon Shinku Gijutsu Kabushiki Kaisha, Chigasaki, Japan

[21] Appl. No.: 321,221

[22] Filed: Mar. 9, 1989

[30] Foreign Application Priority Data

Mar. 11, 1988 [JP] Japan .................. 63-56415
Mar. 31, 1988 [JP] Japan .................. 63-75830

[51] Int. Cl.⁵ .............................................. H01J 37/20
[52] U.S. Cl. ................................. 250/492.3; 250/398
[58] Field of Search ............ 250/396 R, 398, 492.21

[56] References Cited

U.S. PATENT DOCUMENTS

| | | | |
|---|---|---|---|
| 4,110,623 | 8/1978 | Pirraudin | 250/398 |
| 4,352,985 | 10/1982 | Martin | 250/306 |
| 4,465,934 | 8/1984 | Westerberg et al. | 250/398 |
| 4,486,664 | 12/1984 | Wollnik | 250/292 |
| 4,757,208 | 7/1988 | McKenna et al. | 250/398 |
| 4,853,545 | 8/1989 | Rose | 250/396 ML |

Primary Examiner—Bruce C. Anderson
Attorney, Agent, or Firm—Brady, O'Boyle & Gates

[57] ABSTRACT

An ion implanter systems in which a deflector system comprises a first multiple pole electrostatic deflector having five or more poles for deflecting ion beams and a second multiple pole electrostatic deflector having poles of the same number as that of said first multiple pole electrostatic deflector and disposed coaxially at the rear of said first multiple pole electrostatic deflector for deflecting and pointing the ion beams deflected by said first multiple pole electrostaic deflector to a definitely predetermined direction, and said first and second deflectors are controlled so as to scan a region defined by an equilateral polygon whose sides are in number equal to or twice the poles of said each electrostatic deflector.

8 Claims, 9 Drawing Sheets 22.5°

FIG.16
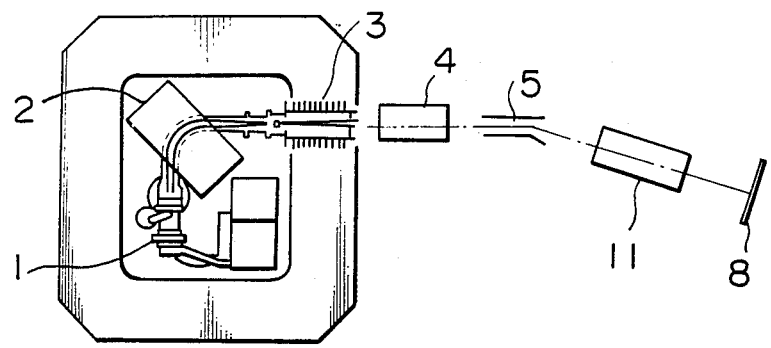
FIG.17
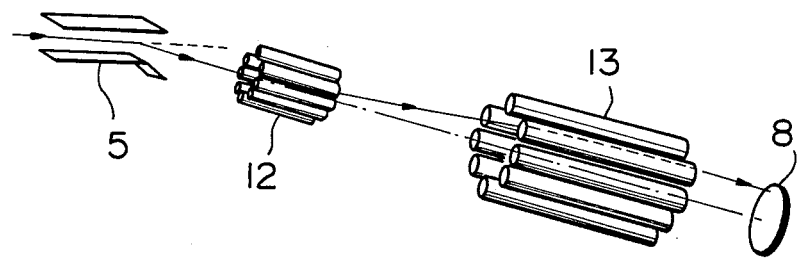
FIG.18A
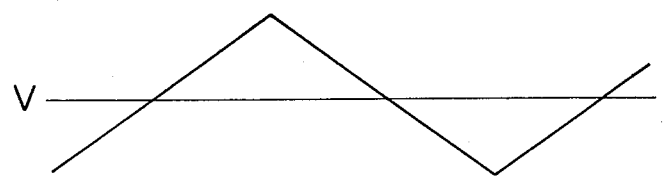
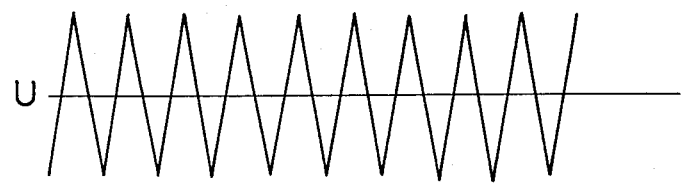
FIG.18B

ION IMPLANTATION DEVICE

FIELD OF THE INVENTION

The present invention relates to an ion implanter system in which an ion implantation is performed on a target such as so-called wafers, substrates or the like by irradiating an ion beam thereto.

BACKGROUND OF THE INVENTION

As well-known an ion implantation is utilized to perform an impurity doping or a material synthesization on a substrate by irradiating an accelerated ion onto the surface thereof. The doping can be performed without any influence of the surface condition of the substrate and with very high accuracy and cleanliness. Therefore, the ion implantation is utilized for manufacturing LSI elements, VLSI elements or the like, or synthesizing an alloy or an amorphous material.

A conventional ion implanter system is shown in FIG. 1 of the accompanying drawings, in which it comprises an ion source A, a mass spectrometer having an analyzer magnet and intended to take out ions having a predetermined kinetic energy and mass from other ions produced in the ion source A, an acceleration system having an acceleration tube C for accelerating the ions taken out by the mass spectrometer, a converging lens system D, a deflector/scanner system having Y direction scanning electrode E and X direction scanning electrode F, and a sample processing chamber which contains a sample to be ion implanted.

In the ion implanter system it is important that the scanning system should be constructed to eliminate neutral particles in order to improve the uniformity of the doping. The neutral particles are generated by colliding the ion beams with residual gas molecules while the ion beams from the ion source are transmitted to the sample and making the charge exchange therebetween. The ion implanter system is therefore provided with means for deflecting the center line of the beams by 7° to avoid the incidence of the neutral particles on the sample, lest the uniformity should be deteriorated by an enhanced doping at the central portion of the sample with the neutral particles. That is, it is usual to provide a voltage control in the X direction scanning electrode F by superimposing a DC bias for deflecting the ion beams by 7° on a scanning triangular wave for the X direction scanning electrode F.

In the conventional ion implanter systems of parallel plates electrostatic X-Y scanner type, the range of a uniform electric field is narrowed due to a disturbance in the electric field at the edge portion. It is, therefore, necessary to increase the width of the scanner plates and thus the size of the electrodes. The system of this type also has a deflecting distortion considerably increased as well as an increased electric capacity. Since the superimposed deflection voltage for eliminating the neutral particles and the scanning triangular wave voltage are applied to at least one scanning electrode of the deflector/scanner system, the voltage to be applied to the electrode is increased, and thus it is necessary to generate a high voltage. Therefore, the triangular wave voltage becomes obtuse in case of high speed scanning. If the voltage is higher, it is substantially impossible to protect the system from any corona discharge or leakage, which makes it difficult to design a scanning power source. Furthermore, the life-time of a power source is shortened.

On the other hand, as the microfabrication of a wafer progresses and the pattern line width decreases, a shadowing effect in ion implantation becomes a problem. For a CMOS DRAM having 4 M bits memory or more, thus, it is necessary to ion implant the whole surface of a wafer with an ion beam pointed parallel to a definitely predetermined direction. More specifically, as the wafer size is increased from 6 to 8 inches and the memory size of the DRAMs increases to 4 M or further 16 M bits, and thus the pattern width is reduced, the need of parallel ion beam implantation has become to be closed-up. With the conventional raster scan type ion implanter having a pair of deflectors for scanning an ion beam, however, even if a distance between the deflectors and the wafer to be ion implanted is 160 cm, the maximum deflecting angle for a 6-inch wafer becomes $a_{max} = 2.7°$ In a conventional electrostatic X-Y sweeping type deflector system, an ion beam has a deflection angle except the center portion because the ion beam is raster-scanned in X and Y directions. Thus, when such ion beam is implanted to a flat wafer, an implantation incidence angle difference occurs from point to point. This phenomenon causes a shadowing effect in the ion implantation in fabricating semiconductor devices. Further, the uniformity of the ion implantation is deteriorated at the periphery portion of the wafer where the solid angle of the ion beam cut by unit area of wafer diminishes, also feasibly causing channeling at the periphery portion.

In the conventional system the deflecting angle $\theta$ is larger at the periphery portion than at the center portion of the wafer, and the depth of the ion implantation in the wafer is shallower at the periphery portion than at the center portion thereof because it is determined by the vertical component of the velocity of implanted ion. As a result, the uniformity of doping is deteriorated. If it is intended to restrain the deflecting angle $\theta$ within a predetermined level upon the ion implantation for a wafer having a larger diameter, it is necessary to lengthen the ion beam transmitting system, and thus the whole system is enlarged, thereby increasing the floor area of the machine and the manufacturing cost of products.

As the memory size of DRAM increases to 4 M or 16 M bits the trench construction is inevitable, and the microfabrication of a wafer involves the increasing of an aspect ratio of trenches. If the ion implantation is performed on the bottom of a trench having a large aspect ratio, it is impossible to obtain a uniform ion implanting all over the bottom surface by using the ion beam with a deflection angle $\theta$. This difficulty may be reduced to a certain extent by carrying out the ion implantation while the wafer is rotated, but cannot fully be overcome. When the ion implantation is made on the side wall(s) of the trench, the wafer is inclined in correspondence with the aspect ratio of the trench in order to avoid shadowing. It is, however, difficult to obtain a uniform ion implantation on the side wall. When the ion beam is implanted obliquely on the side wall of the trench, there may appear a portion of the side wall on which the ion implantation is not carried out.

Then, there has been proposed a parallel sweeping system for implanting ions to a wafer from a definitely predetermined direction by using two sets of parallel plates electrostatic deflectors, in which the ion beam is deflected by $a°$ by the first electrostatic deflector, run at a distance L and then again deflected by $-\alpha°$ by the second electrostatic deflector.

In the above-mentioned parallel plates deflector systems, the available region is narrowed due to the disturbance of the electric field at the edge portion. The width of the parallel plates scanner is necessitated to be at least 2 W for its gap of W, considering the half gap disturbance of the field at both edges. In the deflector of the rear stages, there arise drawbacks that it has an increased electric capacity, the triangular wave voltage becomes obtuse ordinary scanning, and it becomes difficult to design a scanning power supply.

It is, therefore, an object of the present invention to overcome the problems of nonuniformity of an ion implantation in a target due to the increasing of the diameter thereof and of a shadowing due to the trench construction.

Another object of the present invention is to provide an ion implanter system in which a target can be swept by a parallel scanning beam which is incident all over the target at the same incident angle.

Another object of the present invention is to provide an ion implanter system in which a deflector/scanner system comprises a separated deflecting section and scanning section, and the scanning section include electrodes having a broad effective region and a small deflecting distortion.

A further object of the present invention is to provide an ion implanter system which is capable of providing a parallel scanning ion implantation of a target.

SUMMARY OF THE INVENTION

According to one aspect of the present invention, there is provided an ion implanter system comprising a deflector system including a first multiple pole electrostatic deflector having five or more poles for deflecting ion beams, and a second multiple pole electrostatic deflector having the same number of poles as that of said first multiple pole electrostatic deflector and disposed coaxially at the rear of said first multiple pole electrostatic deflector for deflecting and pointing the ion beams deflected by said first multiple pole electrostatic deflector to a definitely predetermined direction, each of the corresponding electrodes of said first and second multiple pole electrostatic deflectors being disposed in the same plane including the optical axis and on the opposite side concerning the axis to each other, and means for controlling said first and second multiple pole electrostatic deflectors so as to scan a region defined by an equilateral polygon whose sides are in number equal to or twice the number of poles of said each deflector, a target being constantly scanned by means of the parallel ion beams pointed parallel to the definite predetermined direction.

According to a second aspect of the present invention, there is provided an ion implanter system comprising a deflector system including a first multiple pole electrostatic deflector having five or more poles for deflecting ion beams, and a second multiple pole electrostatic deflector having a similar configuration to said first multiple pole electrostatic deflector and disposed coaxially at the rear of said first multiple pole electrostatic deflector for deflecting and point the ion beams deflected by said first multiple pole electrostatic deflector to a definitely predetermined direction, each of the corresponding electrodes of said first and second multiple pole electrostatic deflectors being disposed in the same plane including the optical axis and on the opposite site side concerning the axis each other, and scanning control means for applying the same voltage to the electrodes in said first and second multiple pole electrostatic deflectors so as to scan a region defined by an equilateral polygon whose sides are in number equal to or twice the number of poles of said each electrostatic deflector, a target being constantly scanned by means of the parallel ion beams pointed parallel to the definite predetermined direction.

In the preferred embodiment of the present invention, each of the first and second multiple pole electrostatic deflectors is an octapole electrostatic deflector.

The scanning control means may be arranged so that the parallel ion beams scan downwards, upwards, downwards and so on over the full scanning region at a constant speed along parallel lines drawn with a definite spaced interval thereon, and successive scans trace the parallel lines displaced from the said preceding lines by one quarter, one third or half of the interval.

In the ion implanter system according to the present invention, the ion beams generated by the ion source are fed into the mass spectrometer by which single atom or molecule ions having the same charge are selected. The ions thus selected are accelerated by the acceleration tube and converged by the converging lens system. Then, the ion beams are deflected by a constant angle (about 7°) by a two-pole electrostatic deflector to eliminate any neutral particles, deflected by a predetermined angle by the first multiple pole electrostatic deflector, passed through a drift space defined between the first and second deflectors, and then introduced into the second deflector. The ion beams introduced into the second deflector are deflected at the same angle in a direction reverse to the deflecting direction with the first deflector so that the ion beams have a propagating direction which is parallel to the axis, and then irradiated from the second deflector to be incident to the substrate in a constant direction.

In the ion implanter system according to the one aspect of the present invention, a multiple pole deflecting voltage may be applied to each of the electrodes in the first multiple pole electrostatic deflector, and a deflecting voltage having a similar waveform to that of the multiple pole deflecting voltage and in phase therewith is applied to the corresponding electrode of the second multiple pole electrostatic deflector. These deflecting voltages may be determined so that the scanning is performed for the region defined by the equilateral polygon whose sides are in number equal to or twice the number of poles of said each electrostatic deflector.

In the ion implanter system according to the second aspect of the present invention, the same deflecting voltage may be applied to the respective electrodes in the first and second multiple pole electrostatic deflectors.

According to a third aspect of the present invention, there is provided an ion implanter system comprising an ion source, a mass spectrometer for selecting ions having a predetermined kinetic energy and mass from ions produced in said ion source, an accelerator system for accelerating the ions passed through said mass spectrometer, and a deflector/scanner system having a deflector for eliminating any neutral particles contained in the ion beams and a multiple pole deflector for scanning a sample, said neutral particles eliminating deflector and multiple pole deflector being supplied with independently controlled voltages, respectively.

According to a fourth aspect of the present invention, there is provided an ion implanter system comprising an ion source, a mass spectrometer for selecting ions having a predetermined kinetic energy and mass from other ions produced in said ion source, an accelerator system for accelerating the ions passed through said mass spectrometer, and a deflector/scanner system having a deflector for eliminating any neutral particles contained in the ion beams and multiple pole deflectors for scanning a sample, said multiple pole deflectors comprising a first multiple pole deflector for deflecting the ion beams and a second multiple pole deflector for deflecting and pointing the ion beams deflected by said first multiple pole electrostatic deflector to a definitely predetermined direction with respect to the surface of said sample.

Preferably, the second multiple pole deflector has a similar configuration to the first multiple pole electrostatic deflector.

Preferably, the scanning multiple pole electrostatic deflectors may be octapole electrostatic deflectors.

DC voltage may be applied to the deflector for eliminating the neutral particles, and a scanning voltage may be applied to the respective scanning multiple pole deflectors. These voltages may be independently controlled so that they are restricted to a relatively lower level. With the two scanning multiple pole deflectors there may be obtained ion beams which are parallel to the optical axis and thus are effective in making a parallel scanning. Furthermore, the uniformity of the ions to be implanted into the sample may be improved by increasing the scanning frequency of the scanning voltage.

The invention will now be described, by way of example, with reference to the accompanying drawings:

BRIEF DESCRIPTION OF THE DRAWINGS

FIG. 16 is a schematic view showing another embodiment of the present invention;

FIG. 17 is an enlarged perspective view showing a modification of the system of FIG. 16;

FIGS. 18A and 18B show the voltage waveforms which are applied to the electrodes.

DETAILED DESCRIPTION

Figure 1:
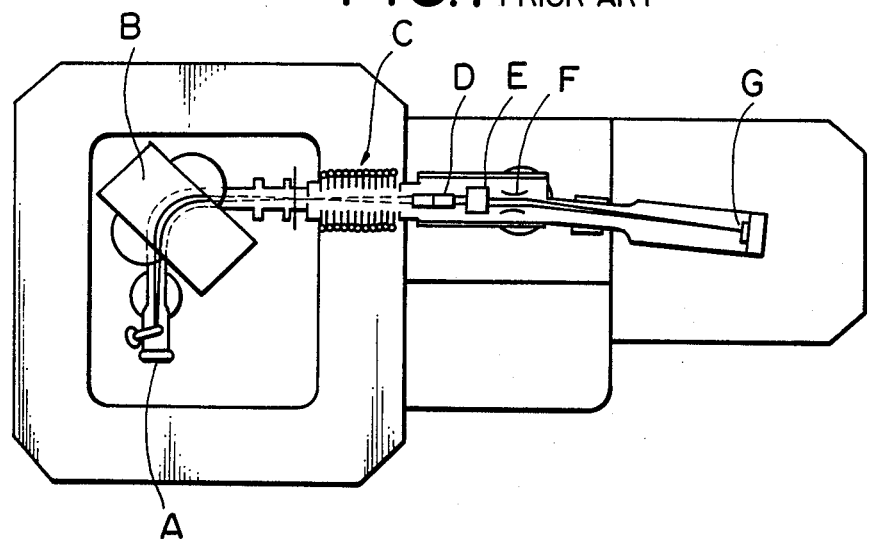
FIG. 1 is a schematic view of a conventional ion implanter system.
Figure 2:
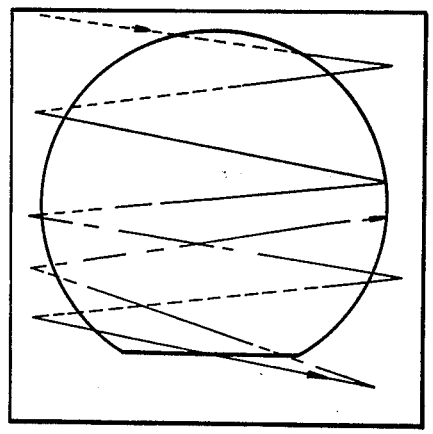
FIG. 2 is a view showing a scanning chart in the conventional ion implanter system.
Figure 3:
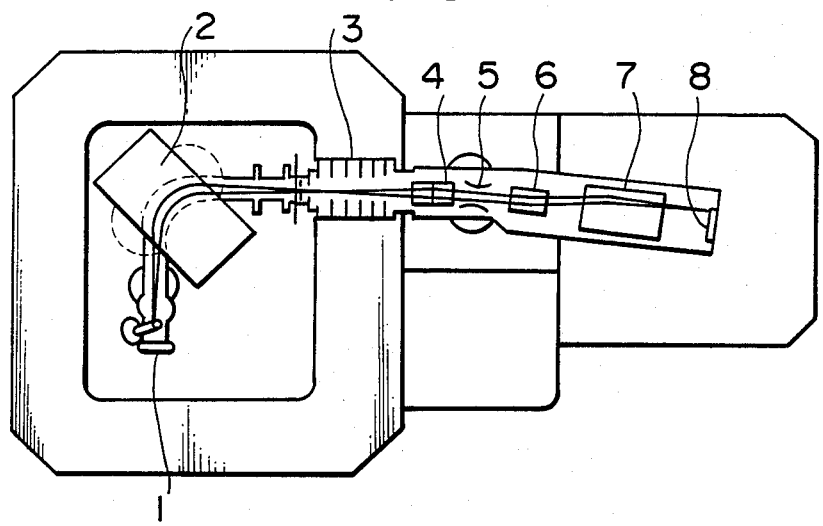
FIG. 3 is a schematic view showing an embodiment of the present invention.

With reference to FIG. 3 of the drawings there is shown the overall construction of an ion implanter system according to an embodiment of the present invention.

In FIG. 3, reference numeral 1 designates an ion source, reference numeral 2 designates a mass spectrometer for separating only single atom or molecule ions having the same charge from other ions produced by the ion source 1, reference numeral 3 an accelerator tube, reference numeral 4 a quadrupole lens, reference numeral 5 a double-pole electrostatic deflector for eliminating neutral particles contained in the ion beams, reference numeral 6 a first multiple pole electrostatic deflector whose central axis is positioned on the optical axis in the direction of the central axis of the ion beams deflected at a predetermined angle by the double-pole electrostatic deflector 5, and reference numeral 7 a second multiple pole electrostatic deflector which is disposed at the rear of the first multiple pole electrostatic deflector 6 and has a size larger than that of the first deflector 6. These deflectors 6 and 7 form a deflector system. Reference numeral 8 denotes a target onto which the ion beams are to be implanted.

Figure 4:
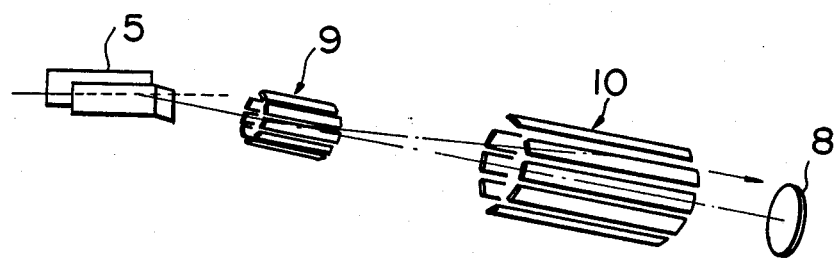
FIG. 4 is an enlarged perspective view showing essential components in the system of FIG. 3.

As will be seen in FIG. 4, the double-pole electrostatic deflector 5 is operated to deflect the ion beams at a predetermined angle, thereby eliminating the neutral particles contained in the ion beams.

Figure 5:
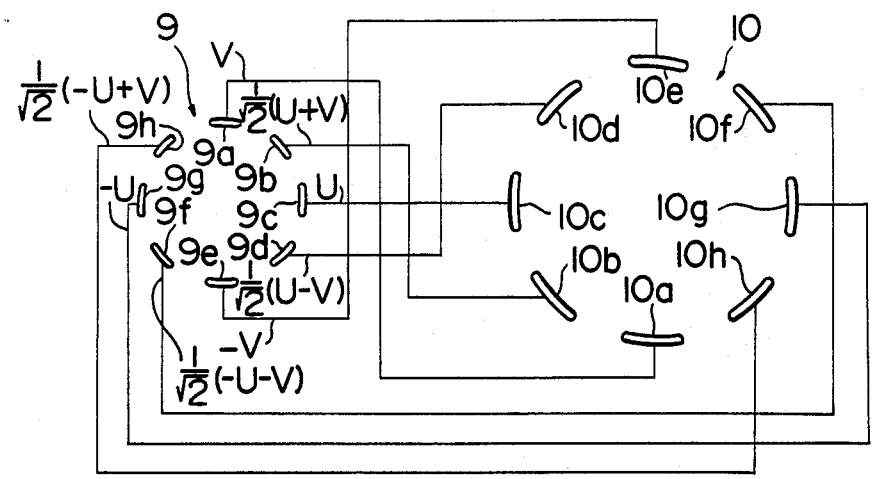
FIG. 5 is a schematic diagram showing how electrodes are electrically connected and voltages are applied thereto.

The first and second multiple pole electrostatic deflectors 6 and 7 comprise octapole electrostatic deflectors 9 and 10, respectively. As shown in FIG. 5, the first and second octapole electrostatic deflectors 9 and 10 comprise eight electrodes 9a to 9h and 10a to 10h, respectively. Each of the electrodes 9a to 9h and 10a to 10h in the first and second deflectors 9 and 10 has a rectangular cross section with rounded corners, and is electrically connected as shown in FIG. 5. More specifically, each of the electrodes of the first octapole electrostatic deflector 9 is connected to the electrode of the second octapole electrostatic deflector 10 which is disposed symmetrically with respect to a central axis, and these electrodes of the first and second octapole electrostatic deflectors 9 and 10 are supplied with voltages as shown by eight power sources (not shown) each of which generates an electrostatic deflecting voltage and constitutes a scanning control system.

The operation of the illustrated system will be described with reference to FIG. 6.

Figure 6:
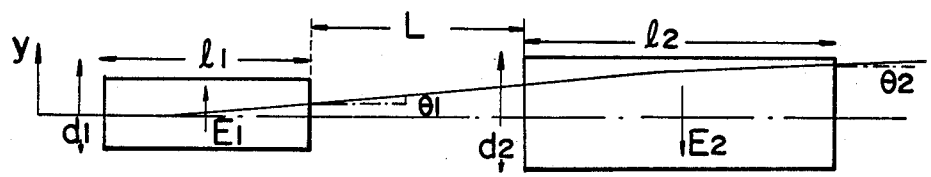
FIG. 6 is an explanatory view of a principle of parallel sweeping.

As shown in FIG. 6, it is assumed that the first octapole electrostatic deflector 9 has a diameter d1 and a length l1, the second octapole electrostatic deflector 10 has a diameter d2 and a length l2, the distance between the first and second deflectors 9 and 10 is designated by L, an electric field in the first deflector 9 is designated by E1, an electric field in the second deflector 10 is designated by E2, the ion beams have exit angles (deflection angles) $\theta 1$ at the outlet side of the first deflector 9 and $\theta 2$ at the outlet side of the second deflector 10, and the ions before entering the first deflector 9 have an energy UO. There are obtained the following equations:

$$\tan \theta 1 = E1 \cdot l1/2U0$$
$$\tan \theta 2 = E1 \cdot l1/2U0 - E2 \cdot l2/2U0 \quad (1)$$

In this case, if the following relation is satisfied, $$E1 \cdot l1/2UO = E2 \cdot l2/2UO \quad (2)$$

there is obtained $\tan \theta 2 = 0$, and conditions for the parallel sweeping can be provided.

If the first and second deflectors 9 and 10 are similar in configuration, and when a voltage V is applied to the electrode 9a of the first deflector 9 and the electrode 10a of the second deflector 10, $1\sqrt{2}$ (U+V) is applied to the electrode 9b of the first deflector 9 and the electrode 10b of the second deflector 10, U is applied to the electrode 9c of the first deflector 9 and the electrode 10c of the second deflector 10 and so on, the electric fields E1 and E2 are parallel to each other but have opposite directions, and then the electric fields E1 and E2 are represented by the following equations:

$$E1 = \lambda V/d1, \ E2 = \lambda V/d2 \quad (3)$$

From the equations (2) and (3), the following relation may be derived:

$$\lambda V/UO \cdot l1/d1 = \lambda V/UO \cdot l2/d2$$

Since the first and second deflectors 9 and 10 are similar in configuration, the following relation may be obtained:

$$l1/d1 = l2/d2 \quad (4)$$

Multiplying both the terms of the relation (4) by $\lambda V$, the following relation may be obtained:

$$\lambda V \cdot l1/d1 = \lambda V \cdot l2/d2$$

Therefore, there may be obtained:

$$E1 \cdot l1 = E2 \cdot l2 \quad (5)$$

and thus the parallel sweeping conditions of the equation (2) may be satisfied.

Figure 7:
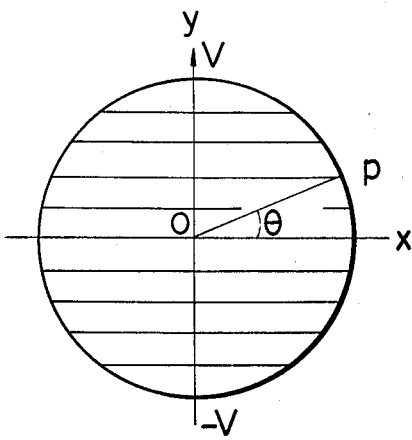
FIG. 7 is an explanatory view how the voltage is applied to the electrodes of a multiple pole electrostatic deflector.

With reference to FIG. 7, it will be described how and what voltages are to be applied to the respective electrodes of the first and second deflectors in order to generate a uniform electric field -V/rO in a -y-axis direction. In FIG. 7, it is assumed that the deflector has a cylindrical section to the periphery of which potentials are applied.

Considering the radius OP forming an angle $\theta$ with respect to the x-axis direction, the following relation may be provided.

$$\phi = V/rO \cdot rO \sin \theta = V \sin \theta$$

where $\phi$ is the potential on the point P. More specifically, when the potential as designated by $V \sin \theta$ is given to the periphery of the deflector, a uniform electric field -V/rO may be formed in the -y-axis direction in the cylindrical deflector. Similarly, when the potential U $\cos \theta$ is given to the periphery of the deflector, a uniform electric field -U/rO may be formed in the -x-axis direction in the cylindrical deflector. Then, the potential distribution such as $V \sin \theta + U \cos \theta$ is given to the periphery of the deflector, there may be obtained a uniform electric field E which consists of the superimposed -x-axis direction field component -U/rO- and y-axis direction field component -V/rO.

With the octapole deflectors of the illustrated embodiment, $V \sin \theta + U \cos \theta$ becomes as shown in FIG. 5.

Figure 8:
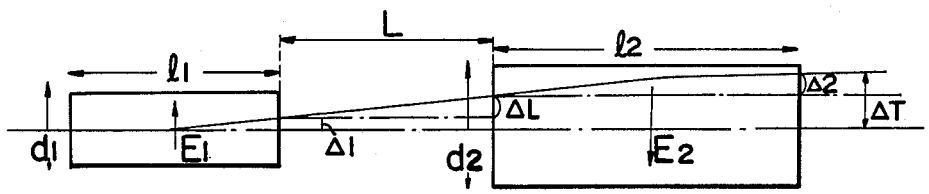
FIG. 8 is an explanatory view showing how the deflection is calculated on the parallel sweeping.

With reference to FIG. 8, the scanning region and voltage waveform will be described when the first and second deflectors are similar in configuration.

In FIG. 8, it is assumed that an electric field in the first octapole deflector 9 is E1 and an electric field in the second octapole deflector 10 is E2 at a moment of the scanning. The electric fields E1 and E2 have opposite directions as described above, and then the relation $E1 \cdot l1 = E2 \cdot l2$ is satisfied.

A deflection $\Delta 1$ at the outlet of the first octapole deflector is represented by the following equation:

$$\Delta 1 = E1 \cdot l1^2/4UO$$

A deflection $\Delta L$ in the drift space is represented by the following equation:

$$\Delta L = E1 \cdot l1^2 L/2UO$$

Further, a deflection $\Delta 2$ at the outlet of the second octapole deflector is represented by the following equation:

$$\Delta 2 = (E1 \cdot l1 l2/2UO) - (E1 \cdot l2^2/4UO) = E1 \cdot l1 l2/4UO$$

Therefore, a total deflection $\Delta T$ is as follows:

$$\Delta 1 + \Delta L + \Delta 2 = E1 \ 1/UO \ (l1^2/4 + l1L/2 + l1l2/4) \quad (6)$$

Figure 9:
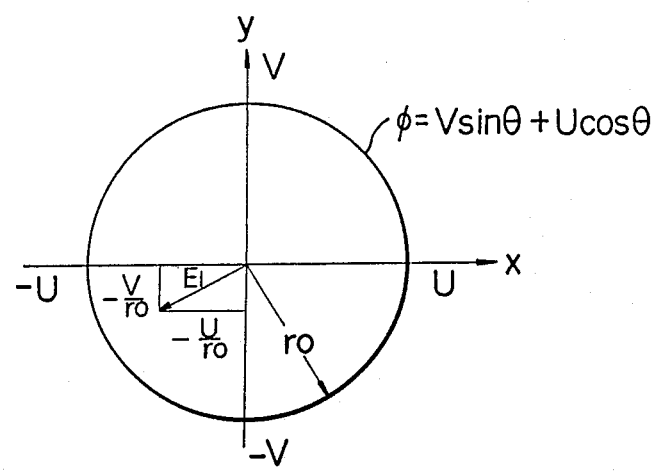
FIG. 9 is an explanatory view showing an electric field and voltages to be applied to the respective electrodes in the deflector.

In FIG. 9, assuming that the potential distribution such as $V\sin\theta + U\cos\theta$ is given to the periphery of a circle having a radius ro, then an electric field vector $\overrightarrow{U/ro}$ may be produced in the -x-axis direction and an electric field vector $\overrightarrow{v/ro}$ in the -y-axis direction, thus producing a resultant vector $\overrightarrow{E1}$. Therefore, the resultant vector $\overrightarrow{E1}$ has the same magnitude as that of a position vector on a point in the scanning chart and is proportional thereto.

Figure 10:
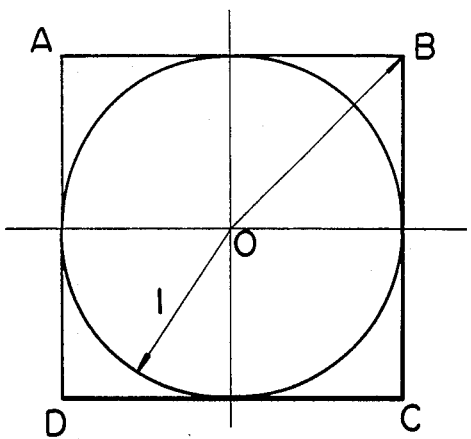
FIG. 10 is a view explaining how to calculate a voltage to be applied to each electrode in an octapole deflector when the scanning region to be scanned is a square.

Now, as shown in FIG. 10, it is assumed that the scanning is made for the region within a circumscribed regular tetragon about a target of a radius 1, V=1 and U=1, then there will be obtained VB=1, UB=1 and $1\sqrt{2}$ (UB+VB)=$\sqrt{2}$ at the position B. It is appreciated that the voltage to be applied to the electrodes positioned at 45° is $\sqrt{2}$ times as great as that to be applied to the electrodes positioned on the x- and y-axes. If this voltage is the upper limit of the voltage which may be generated by the scanning power source, the voltage which can be applied to the electrodes on the x- and y-axes is only $1\sqrt{2}=0.707$ times (or 70.7%) of the upper limit of the power source voltage. More particularly, since the total deflection $\Delta T$ in the x- and y-axis directions is proportional to the scanning voltage to be applied to the electrodes on the x- and y-axes, that is E1, the voltage capable of being applied to the electrodes on the x- and y-axes is limited up to 70.7% of the upper limit of the power source voltage. In order to attain 100% deflection in the x- and y-axis directions, therefore, the voltage corresponding to 141% of the power source voltage must be added to the voltage at the 45° direction. This means that the output voltage required for power supplies should be increased over the possible upper limit as the diameter of the target is increased from 6 inch to 8 inch, thus making it difficult to scan the target having a diameter of 8 inch.

Figure 11:
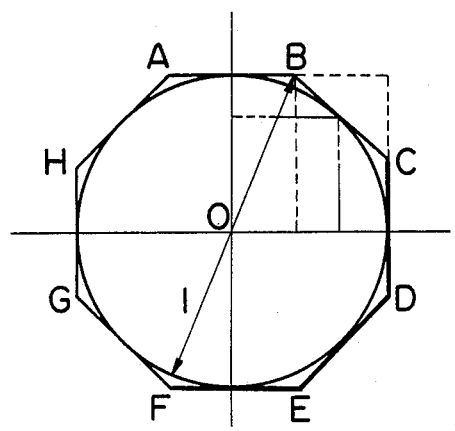
FIG. 11 is a view explaining how to calculate a voltage to be applied to each electrode in an octapole deflector when the scanning region to be scanned is an octagon.

However, as shown in FIG. 11, if the scanning region is a regular octagon circumscribed about the target, the following relations may be obtained at a point B, namely, when a raster point is at F.

$$VB=1, AB+\sqrt{2}\cdot AB=2, \tfrac{1}{2}AB=1/(1+\sqrt{2}),$$

$$UB=1/(1+\sqrt{2}),$$
$$1\sqrt{2}(VB+UB)=(1\sqrt{2})\cdot[1+1/(1+\sqrt{2})]=(1\sqrt{2})\cdot[(2+\sqrt{2})/(1+\sqrt{2})]=1$$

Therefore, at the point B, the voltage to be applied to the electrode positioned at 45° is identical to the peak value of the voltage applied to the electrodes on the x- and y-axes, that is 1.

At a point on BC, namely, when a raster point is on FG, since $U+V$ is equal to the value of the voltage at the point B (see FIG. 11), the voltage to be applied to the electrode positioned at 45° becomes equal to the peak value of the voltage applied to the electrodes on the x- and y-axes.

When the scanning is performed over the region as shown in FIG. 11, the peak values of the voltage waveforms to be applied to the eight electrodes are equal to each other.

The consideration mentioned above is applicable to the case when the first and second multiple pole deflectors are of a type having five or more similar poles. If the scanning region is a regular polygon having sides which are in number equal to the number of the poles, each of the deflecting voltages to be applied to the respective electrodes has the same peak value.

Figure 12:
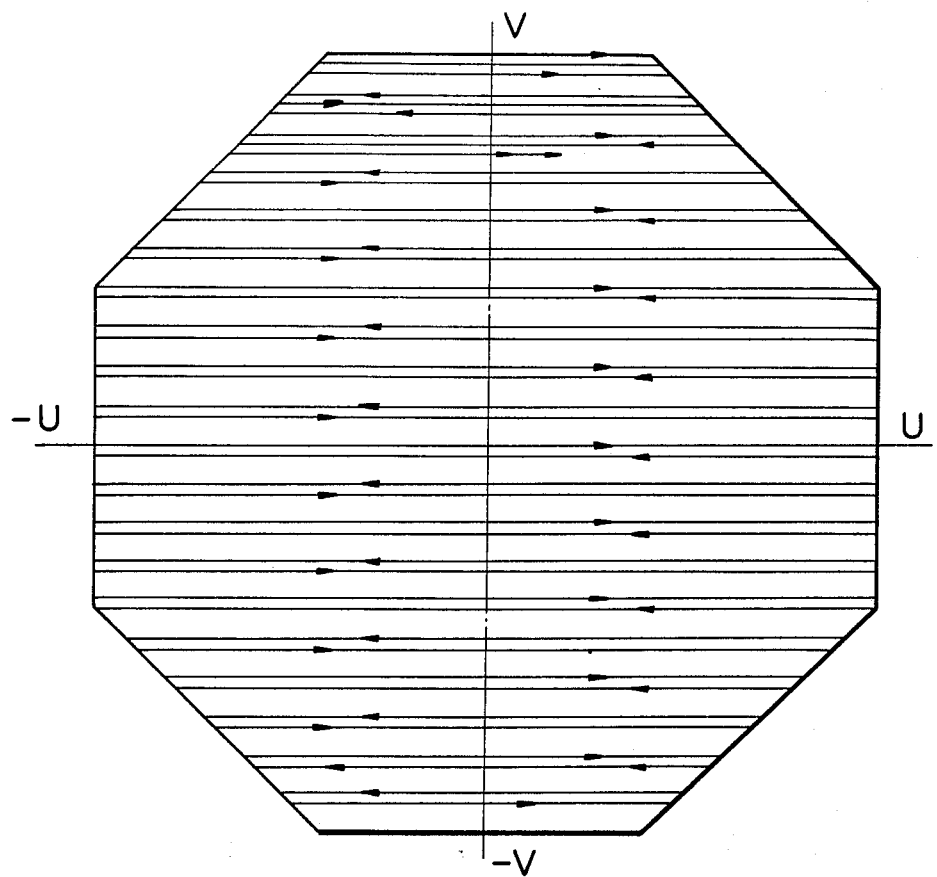
FIG. 12 is an explanatory view showing an example how the octagonal scanning region is scanned.

FIG. 12 shows an example of a scanning on the octapole deflector.

A regular octagon circumscribed about the target is scanned in such a manner that the parallel ion beam scans downwards, upwards, downwards and so on over the full scanning region at a constant speed along parallel lines drawn with a definite spaced interval thereon, and in such a way that the successive scan traces along parallel lines displaced from the said preceding lines by one quarter, one third or half of the spaced interval.

Figure 13A:
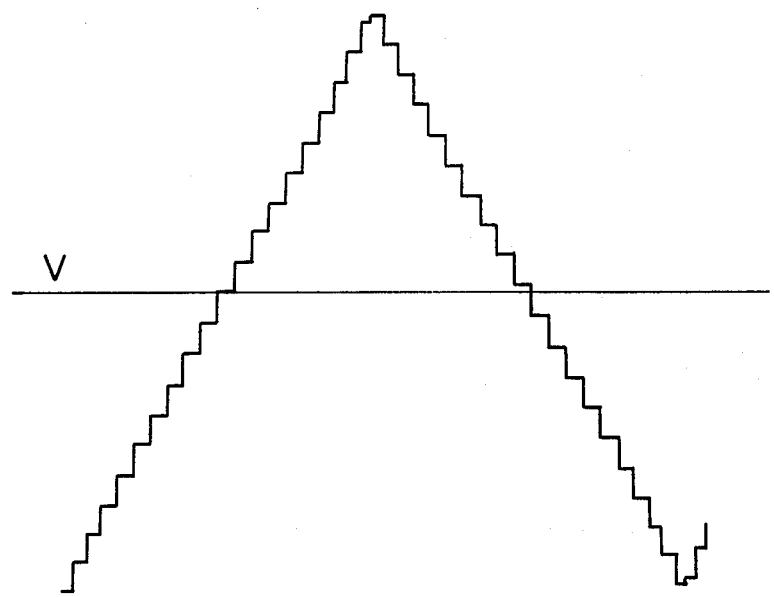
FIGS. 13A and 13B are waveforms of the voltages to be applied to the respective electrodes in case of FIG. 12.
Figure 13B:
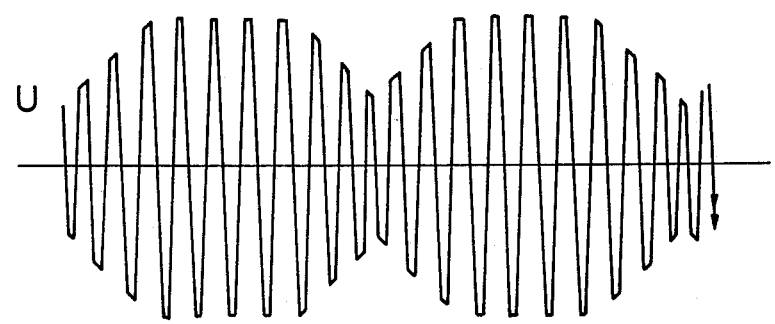

FIGS. 13A and 13B show an example of waveforms of the voltages V and U. From these waveforms of V and U there are produced $-V, -U, 1\sqrt{2}(U+V), 1\sqrt{2}(U-V), 1\sqrt{2}(-U+V)$ and $1\sqrt{2}(-U-V)$ which are applied to the electrodes, respectively.

Another example of a scanning procedure will be described hereinafter.

For a DRAM having 4M bits or more, the provision of a trench structure is essential. Such a trench has side walls which are almost all bent at 90° and for which an ion implantation should be performed. It may be considered that the ion implantation is performed while the target is rotated by 90° about the rotating axis inclined at a constant angle with respect to the incident direction of the ion beams.

Firstly, the ions of a certain amount are implanted on one side wall of the trench in the target, and then the target is turned by 90° while the ion beam is interrupted, after which the ions of the same amount are implanted. Again, the ion beam is interrupted, and the target is further turned by 90° to perform the ion implantation with the ions of the same amount.

In this way, after the ions of a predetermined amount are implanted onto the respective side walls of the trench in the target, this target is removed and a new target is set for performing an ion implantation. In this connection, the ion implantation onto one side wall of the trench is commenced from the upper left side portion of the region to be scanned, and the amount of the ions implanted onto the target is determined by suitable integrator equipment. When the integrated amount raises to a predetermined level, a signal is generated by the integrator and is fed to the power source of the deflector, thereby controlling the system so that the ion beam is not interrupted until a raster-scanning is completed to end if it is on the way at that moment.

Figure 14:
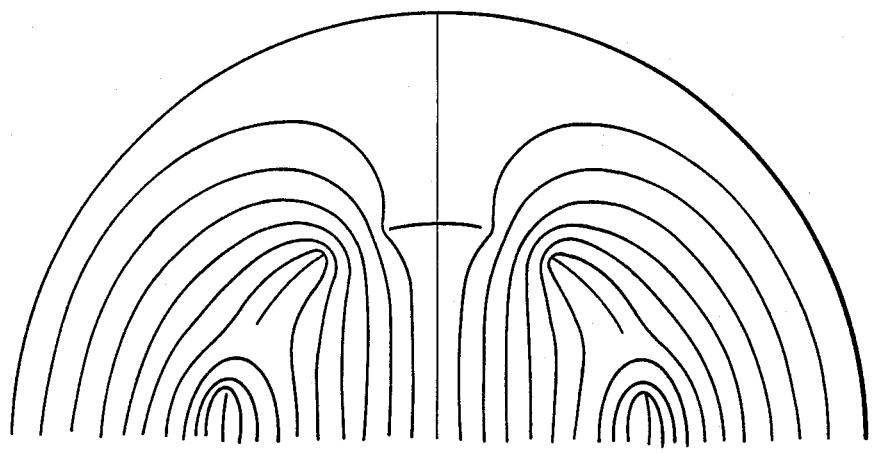
FIGS. 14 and 15 are computer simulated schematic diagrams showing equipotential lines in an octapole electrostatic deflector.
Figure 15:
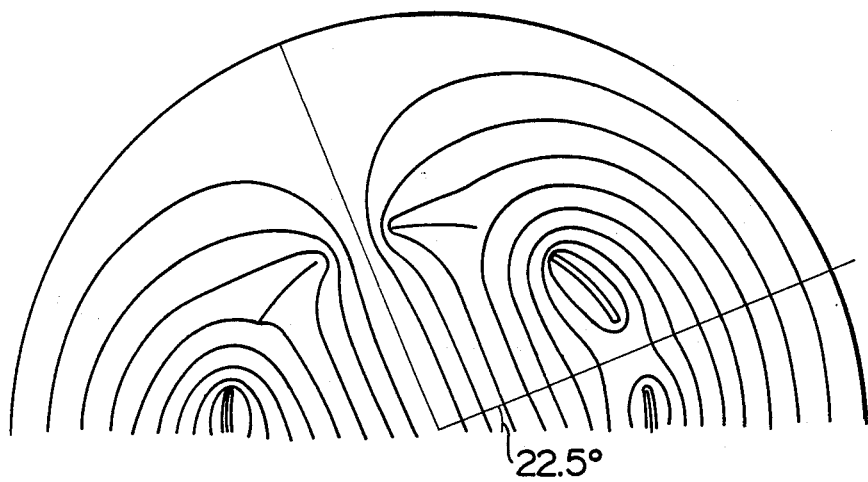

FIGS. 14 and 15 show computer simulated equipotential lines in an octapole electrostatic deflector in which each electrode has a circular arc cross section with an included angle of 25° with respect to the center axis of the deflector. The diagram shown in FIG. 15 is the case where a deflection is made in a direction of 2.5°. In either case there may be produced a uniform electric field which prevails over the range of 70% of the diameter in the deflecting direction.

The actual numeric values of the respective portions in the illustrated system will now be exemplified.

With similar shaped octapole electrostatic deflectors in an ion implanter for a target having a diameter of 6 inch, the first octapole deflector is 10 cm in diameter and its length 36 cm, and the second octapole deflector has a diameter of 26 cm and a length of 93.6 cm. The distance between the first and second octapole deflectors is 24.8 cm, and the deflection is 18 cm in diameter. Further, the peak to peak value of each of V and U& is 12.5 KV.

In FIG. 16 there is shown another embodiment of the present invention in which the same reference numerals as those in FIG. 3 designate the same or corresponding components.

In this embodiment, the deflector 5 with a constant deflecting angle comprises parallel flat plate electrodes for eliminating neutral particles included in the ion beams from the ion source 1, and is connected to a suitable DC power source, not shown. Reference numeral 11 denotes a scanning deflector which comprises an octapole electrode assembly for sweeping the ion beams simultaneously in X and Y directions. The scanning deflector 11 is supplied with triangular wave voltages from scanning power sources, not shown.

FIG. 17 shows a modification in which the scanning deflector 11 comprises two sets of octapole electrode assemblies 12 and 13. Each of the electrodes in the first and second sets has a cylindrical cross section, and may be electrically connected in the same manner as that shown in FIG. 5.

FIGS. 18A and 18B show an example of voltage waveforms V and U to be combined by means of a suitable adder, not shown, so as to produce $1\sqrt{2}(U+V), 1\sqrt{2}(-U+V), 1\sqrt{2}(-U-V)$ etc which are applied to the respective electrodes in the first and second sets.

The operation of the illustrated scanning deflector is substantially identical with that described hereinbefore with reference to FIGS. 6 and 7, and therefore its detailed explanation will be omitted. In the illustrated embodiments described above, octapole electrostatic deflectors are employed. It should, however, be understood that it is possible to use multiple pole electrostatic deflectors which comprise poles less than or more than eight poles.

With the ion implanter system according to the first or second aspect of the present invention, as described above, it is appreciated that there can be obtained a uniform electric field which extends over 70% or more of the diameter of the deflectors, and the effective range for the sweeping can be widened as compared with the prior art arrangement of the parallel flat plate deflector, thereby reducing in size the rear stage or second multiple pole electrostatic deflector.

Further, the capacity between the electrodes can be reduced so as to prevent the scanning voltage from having a deviated phase and from becoming blunt, and therefore a parallel ion beam scanning can be performed with high precision.

By defining the scanning region as a regular polygon having sides of the same number as that of the poles in each deflector, the deflecting voltages to be applied to the respective electrodes of each deflector have the same peak value, so that these electrodes can be supplied with voltages up to the upper limit of the output of the deflecting power sources, thereby making it possible to provide a power source for each deflector even if the size of a target is increased from 6 inch to 8 inch.

Further, according to the ion implanter system of the second aspect of the present invention, since the first and second multiple pole electrostatic deflectors are formed similarly in configuration, the same power source can be used for applying the same voltage to the associated electrodes of the first and second multiple pole electrostatic deflectors, and thereby simplification of the deflector system can be achieved.

Furthermore, with the ion implanter system according to the third or fourth aspect of the present invention, since the deflector/scanner system comprises a deflector for eliminating neutral particles and at least one multiple pole deflector for scanning a sample, which are supplied with independently controlled voltages, power sources for these deflectors can be simplified. The voltages to be applied to the deflectors can be maintained at a lower level because they are not superimposed on each other. By provision of the multiple pole deflector for the scanning operation, the effective range for the ion implantation can be widened as compared with the case of the parallel flat plate deflector. By the provision of two sets of scanning deflectors, ion beams can substantially be incident on the sample and parallel to the optical axis thereby improving the uniformity of ions to be implanted on the sample.

The terms and expressions which have been employed herein are used as terms of description and not of limitation, and there is no intention, in the use of such terms and expressions, of excluding any equivalents of the features shown and described but it is recognized that various modifications are possible within the scope of the invention claimed.

What is claimed is:

1. An ion implanter system comprising a deflector system including a first multiple pole electrostatic deflector having five or more poles for deflecting ion beams, and a second multiple pole electrostatic deflector having poles of the same number as that of said first multiple pole electrostatic deflector and disposed coaxially at the rear of said first multiple pole electrostatic deflector for deflecting and pointing the ion beams deflected by said first multiple pole electrostatic deflector to a definitely predetermined direction, each of the corresponding electrodes of said first and second multiple pole electrostatic deflectors being disposed in the same plane including the optical axis and on the opposite side of the axis to each other; and means for controlling said first and second multiple pole electrostatic deflectors so as to scan a region defined by an equilateral polygon whose sides are in number equal to or twice the poles of said each electrostatic deflector, a target being constantly scanned by means of the parallel ion beams pointed parallel to the definitely predetermined direction.

2. A system as claimed in claim 1, wherein each of said first and second multiple pole electrostatic deflectors is an octapole electrostatic deflector.

3. A system as claimed in claim 1, wherein said scanning control means comprise means for scanning the target in such a manner that the parallel ion beams scan downwards, upwards, downwards and so on the full scanning region at a constant speed along parallel lines drawn with a definite interval thereon, and in such a way as the successive scan traces parallel lines displaced from the said preceding lines by one quarter, one third or half of the interval.

4. A system as claimed in claim 1, wherein a multiple pole deflecting voltage is applied to each of the electrodes in said first multiple pole electrostatic deflector, and a deflecting voltage having a similar waveform to that of the multiple pole deflecting voltage and in phase therewith is applied to the corresponding electrode in said second multiple pole electrostatic deflector.

5. An ion implanter system comprising a deflector system including a first multiple pole electrostatic deflector having five or more poles for deflecting ion beams, and a second multiple pole electrostatic deflector having poles of the same number as that of said first multiple pole electrostatic deflector and disposed coaxially at the rear of said first multiple pole electrostatic deflector for deflecting and pointing the ion beams deflected by said first multiple pole electrostatic deflector to a definite predetermined direction, each of the corresponding electrodes of said first and second multiple pole electrostatic deflectors being disposed in the same plane including the optical axis and on the opposite side concerning the axis to each other; and scanning control means for applying the said voltage to the corresponding electrodes in said first and second multiple pole electrostatic deflectors and scanning a region defined by an equilateral polygon whose sides are in number equal to or twice the poles of said each electrostatic deflector, a target being constantly scanned by means of the parallel ion beams pointed parallel to the predetermined direction.

6. A system as claimed in claim 5, wherein each of said first and second multiple pole electrostatic deflectors is an octapole electrostatic deflector.

7. A system as claimed in claim 5, wherein said scanning control means comprise means for scanning the target in such a manner that the parallel ion beams scan downwards, upwards, downwards and so on the full scanning region at a constant speed along parallel lines drawn with a definite interval thereon, and in such a way as the successive scan traces parallel lines displaced from the said preceding lines by one quarter, one third or half of the interval.

8. A system as claimed in claim 5, wherein the same deflecting voltage may be applied to the corresponding electrodes in said first and second multiple pole electrostatic deflectors.

* * * * *